United States Patent
Wu

(10) Patent No.: US 9,878,900 B2
(45) Date of Patent: Jan. 30, 2018

(54) MANUFACTURING METHOD FOR A MICROMECHANICAL PRESSURE SENSOR DEVICE AND CORRESPONDING MICROMECHANICAL PRESSURE SENSOR DEVICE

(71) Applicant: Robert Bosch GmbH, Stuttgart (DE)

(72) Inventor: Zhenyu Wu, Metzingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/372,571

(22) Filed: Dec. 8, 2016

(65) Prior Publication Data

US 2017/0166436 A1 Jun. 15, 2017

(30) Foreign Application Priority Data

Dec. 11, 2015 (DE) .................. 10 2015 224 936

(51) Int. Cl.
| | |
|---|---|
| *H01L 21/00* | (2006.01) |
| *B81B 3/00* | (2006.01) |
| *H01L 21/62* | (2006.01) |
| *H01L 49/02* | (2006.01) |

(Continued)

(52) U.S. Cl.
CPC ........ *B81B 3/0021* (2013.01); *B81C 1/00158* (2013.01); *B81C 1/00182* (2013.01); *H01L 21/62* (2013.01); *H01L 22/30* (2013.01); *H01L 28/75* (2013.01); *B81B 2201/0264* (2013.01); *B81B 2203/019* (2013.01);

(Continued)

(58) Field of Classification Search
CPC ....... H01L 21/62; H01L 28/75; B81B 3/0021; B81C 1/00158
USPC .............................. 257/E21.011; 438/50, 53
See application file for complete search history.

(56) References Cited

U.S. PATENT DOCUMENTS

| | | | |
|---|---|---|---|
| 6,716,737 B2 * | 4/2004 | Plas ...................... | H01L 23/481 257/E21.597 |
| 2010/0176469 A1 * | 7/2010 | Schmollngruber ... | B81B 7/0006 257/419 |

(Continued)

FOREIGN PATENT DOCUMENTS

EP 0515416 B1 4/1994

*Primary Examiner* — Robert Huber
(74) *Attorney, Agent, or Firm* — Norton Rose Fulbright US LLP; Gerard Messina

(57) ABSTRACT

A manufacturing method for a micromechanical sensor device and a corresponding micromechanical sensor device. The method includes providing a substrate including at least one first through a fourth parallel trenches; depositing a layer onto the front side, the trenches being sealed, and structuring the layer, contact structures being formed in the layer above the second and fourth trenches; oxidizing of outwardly free-standing side surfaces of the contact structures as well as of the second and fourth trenches, at least in areas; depositing and structuring a first metallic contacting material, the contact structures being filled with the first metallic contacting material, at least in areas; opening the second trench and the fourth trench; galvanic deposition of a second metallic contacting material into the second and fourth trenches, resulting in the formation of a pressure-sensitive capacitive capacitor structure; and opening the first trench from the front side of the substrate.

8 Claims, 15 Drawing Sheets

(51) Int. Cl.
*B81C 1/00* (2006.01)
*H01L 21/66* (2006.01)

(52) U.S. Cl.
CPC ... *B81B 2203/0127* (2013.01); *B81C 2203/01* (2013.01); *B81C 2203/0778* (2013.01)

(56) References Cited

U.S. PATENT DOCUMENTS

2012/0061734 A1* 3/2012 Mueller .............. B81C 1/00246
 257/254
2012/0267773 A1* 10/2012 Ebefors .................. B81B 7/007
 257/692

* cited by examiner

MANUFACTURING METHOD FOR A MICROMECHANICAL PRESSURE SENSOR DEVICE AND CORRESPONDING MICROMECHANICAL PRESSURE SENSOR DEVICE

CROSS REFERENCE

The present application claims the benefit under 35 U.S.C. § 119 of German Patent Application No. DE 102015224936.0 filed on Dec. 11, 2015, which is expressly incorporated herein by reference in its entirety.

FIELD

The present invention relates to a manufacturing method for a micromechanical pressure sensor device and a corresponding pressure sensor device.

BACKGROUND INFORMATION

Pressure sensors based on a MEMS technology may include capacitive structures and/or membranes which run in parallel to a chip front side. A downsizing or reduction of such pressure sensors represents a research and development challenge.

Pressure sensors having parallel detection structures occupy in particular up to more than 70% of the chip surface. In order to reduce the size of these detection structures, a reduction of corresponding layer thicknesses is in particular also necessary. However, a reduction of layer thickness in the corresponding membranes proves to be difficult, since a smaller membrane may have reduced sensitivity. The result of this may be, in particular, that such pressure sensors do not satisfy the sensitivity requirements of an ASIC or a similar evaluation circuit.

Furthermore, the membrane sizes or the structures of the pressure sensors must be varied specific to the application. The result of this is that complex and costly methods are necessary for pressure sensors having a broad application spectrum.

European Patent No. EP 0 515 416 B1 describes a method for manufacturing an integratable, capacitive pressure sensor.

SUMMARY

The present invention provides a manufacturing method for a micromechanical pressure sensor device and a corresponding pressure sensor device.

Preferred refinements are described herein.

In accordance with example embodiments of the present invention, an example method provides in particular pressure-sensitive capacitive capacitor structures on the substrate level. The pressure-sensitive capacitive capacitor structure or membrane structure extends transversely, in particular, perpendicularly to the front side of the substrate. As a result, the micromechanical pressure sensor device described here includes in particular one or a plurality of pressure-sensitive capacitive capacitor structures, which extend transversely, in particular, perpendicularly to the front side of the substrate. This causes the micromechanical pressure sensor system manufactured or provided here to be space-saving in particular.

In other words, the space required on the substrate level for manufacturing the micromechanical pressure sensor device is appropriately reduced. Furthermore, in the method described here as well as in the corresponding micromechanical pressure sensor device, a sensitivity of the pressure-sensitive capacitive capacitor structure is in particular dependent on a lateral lithographic precision of the method, making it possible to manufacture or provide very small micromechanical pressure sensor devices. Furthermore, the micromechanical pressure sensor device described here is energy-efficient due to the capacitive principle. The provision of a vacuum between the pressure-sensitive capacitive capacitor structure manufactured here and the at least one pressure access for the pressure-sensitive capacitive capacitor structure make the micromechanical pressure sensor device described here in particular stable against mechanical stress, in particular within the micromechanical pressure sensor device, which may be caused by a packaging of integrated circuits or during operation.

Furthermore, different pressure ranges may be measured using the micromechanical pressure sensor device described here, it not being necessary to vary a spatial dimensioning of the micromechanical pressure sensor device. This results in a uniform fingerprint, which may be used, for example, for an entire chip generation.

According to one aspect of the present invention, a substrate having at least one first through a fourth trench may be provided in step A of the manufacturing method. Starting from a front side of the substrate, the at least first through fourth trenches extend in parallel to one another, the at least first through fourth trenches having a distance to one another. Furthermore, the trenches described here extend transversely, in particular perpendicularly, to the front side of the substrate. The at least first through fourth trenches do not intersect in the substrate.

In step B, one layer is deposited onto the front side of the substrate, whereby the at least first through fourth trenches are sealed. By structuring of the layer, contact structures are formed above the second and fourth trenches in the layer. The contact structures are free from a material of the layer and expose the second and fourth trenches, starting from a surface of the layer facing away from the front side of the substrate. In particular, the contact structures are delimited at the sides by the adjacent first trench and third trench in lateral direction and do not protrude into areas of the first and third trenches.

In step C, the side surfaces of the contact structures as well as the second and fourth trenches which are exposed to the outside, are oxidized, at least in areas. In this case, an electrically insulating layer is formed, which covers the side surfaces and the corresponding contact structures. Furthermore, the contact structures as well as the second and fourth trenches are not sealed during step C. In particular, the oxidation may be carried out on a silicon substrate, at least in areas. In this case, silicon dioxide forms on the corresponding side surfaces. Alternatively, the contact structures as well as the second and fourth trenches may be coated with a dielectric layer. For this purpose, for example, aluminum oxide, hafnium dioxide or a nitride layer may be used.

In step D, a first metallic contacting material is deposited and structured. In this case, the contact structures are filled with the first metallic contacting material, at least in areas. The first metallic contacting material may in this case in particular be flush with the front side of the substrate. The first metallic contacting material is structured in such a way that in particular electrodes are formed above the second and fourth trenches. The electrodes are used in particular for the later contacting of a pressure-sensitive capacitive capacitor structure. Furthermore, in particular bond pads and metallic strip conductors are formed on a side of the layer facing away from the front side of the substrate. Electrically insulated from one another, the metallic strip conductors may in particular connect the bond pads and the electrodes of the second and fourth trenches with one another. This means that the contact structure above the second trench and the contact structure above the fourth trench are produced to be electrically insulated from one another. The metallic strip conductors in step D and bond pads connected to them are connected to the strip conductors outside of the chip area, so that the first metallic contacting material remains on an identical electrical potential. After the galvanic process in step F, the strip conductors outside of the chip area are removed; consequently, the strip conductors are not in electrical contact with one another within the chip area.

In step E, the second trench and the fourth trench are opened from a rear side of the substrate. In particular, this opening may take place with the aid of trench etching. Consequently, the second trench and the fourth trench pass completely though the substrate from the front side to the rear side of the substrate. The layer deposited in step B may in particular be understood to be a supporting or stabilizing layer.

In step F, a second metallic contacting material is deposited galvanically via the rear side of the substrate in the second and fourth trenches. Here, the second metallic contacting material is deposited on the oxidized side surfaces, resulting in the formation of a pressure-sensitive capacitive capacitor structure. For the second metallic contacting material, for example, nickel, copper, gold or another suitable precious metal may be used.

In other words, the pressure-sensitive capacitive capacitor structure described here includes in particular the second and the fourth trenches, the third trench being formed between the second trench and the fourth trench. In the third trench, a vacuum is formed in step B of the manufacturing method. Thus, the manufacturing method described here may be used for forming the pressure-sensitive capacitive capacitor structure in a vertical direction in relation to the front side of the substrate.

In step G, the first trench is opened from the front side of the substrate, a pressure access being formed for the pressure-sensitive capacitive capacitor structure. In particular, a gas may enter into the first trench via the pressure access, the gas entering into the first trench deforming the vacuum in the third trench, as the result of which a current/voltage change on the pressure-sensitive capacitive capacitor structure becomes measurable. Furthermore, the current or voltage change on the pressure-sensitive capacitive capacitor structure may be tapped in particular on the bond pads or the electrodes. The pressure, for example, in the first trench may be inferred due to the current/voltage change. Furthermore, the pressure access described here may be used for equalizing mechanical stress from the packaging of integrated circuits and/or during the operation of the micromechanical pressure sensor device manufactured here.

According to a preferred refinement, an N-lattice is implemented on the front side of the substrate for forming the at least first through fourth trenches. The implementation of the N-lattice may be promoted in particular by providing a porous silicon, so that when the layer is deposited, a material of the layer is not deposited in the at least first through fourth trenches. Furthermore, the N-lattice promotes the formation of a hermetically sealed vacuum in the third trench.

According to another preferred refinement, a porous silicon is used for the substrate. The at least first through fourth trenches may thus be formed in the substrate in a simple manner. For forming the trenches described here, the APSM (advanced porous silicon membrane) method may in particular be used, at least partially.

According to another preferred refinement, an electronic evaluation unit, for example, CMOS (complementary metal-oxide-semiconductor) and/or a bipolar processor is integrated on the substrate level. For example, the substrate described here may include the electronic evaluation unit and/or the bipolar processor already before the formation of the trenches described here. Thus, the micromechanical pressure sensor device including the electronic evaluation unit may be provided on the substrate level, making it possible to omit complex wafer-wafer bonding methods.

According to another preferred refinement, a monocrystalline silicon is used for the layer. The monocrystalline silicon makes it possible to hermetically seal the at least first through fourth trenches. Furthermore, the material-specific properties of monocrystalline silicon promote the sensitivity of the micromechanical pressure sensor device. The monocrystalline silicon may in particular be deposited homogenously.

According to another preferred refinement, the side surfaces, which are oxidized at least in areas, are used for depositing the first metallic contacting material and the second metallic contacting material. Thus, the first metallic contacting material and the second metallic contacting material are able to be deposited in a defined manner on predetermined areas for producing the pressure-sensitive capacitive capacitor structure, it being possible to prevent the first metallic contacting material from being deposited in the second and fourth trenches, in particular by using smaller aperture diameters.

According to another preferred refinement, when the first metallic contacting material is deposited and structured, the metallic strip conductors are formed at least in areas, and the metallic strip conductors are used for the galvanic deposition of the second metallic contacting material. Thus, based on the metallic strip conductors, a plurality of micromechanical pressure sensor devices may be produced simultaneously on the substrate. Furthermore, a simultaneous galvanic deposition of the second metallic contacting material may be implemented simply and energy-efficiently.

According to another preferred refinement, the metallic strip conductors are removed at least in areas, after the galvanic deposition of the second metallic contacting material. It is thus possible to separate individual micromechanical pressure sensor devices in the form of individual sensors from one another without it additionally being necessary to separate the metallic strip conductors.

According to another aspect of the present invention, a micromechanical pressure sensor device is provided. The micromechanical pressure sensor device includes a substrate having at least one first through a fourth trench, the at least first through fourth trenches extending in parallel to one another starting from a front side of the substrate, a vacuum being formed in the third trench. The second trench and the fourth trench penetrate the substrate and have a second metallic contacting material. With the aid of electrodes, which are in contact with the second metallic contacting material of the first trench and of the fourth trench, at least in areas, it is possible to measure a pressure change in the first trench capacitively.

According to a preferred refinement, the electrodes of the second trench and of the fourth trench protrude into the second and fourth trenches, at least in areas, and are in contact with the second metallic contacting material. It is thus possible to protect the pressure-sensitive capacitive capacitor structure against outside influences.

According to a preferred refinement, the first trench equalizes a mechanical stress occurring during operation and/or functions as a pressure access. Apart from the function of the first trench as a pressure access, it is also capable of reducing or compensating mechanical stresses. Consequently, two functions may be assigned to the first trench.

The features of the manufacturing method for the micromechanical pressure sensor device described here are also for the corresponding micromechanical pressure sensor device and vice versa.

BRIEF DESCRIPTION OF THE DRAWINGS

Additional features and advantages of the present invention are explained below based on specific embodiments with reference to the figures.

FIGS. 1A through 8A show schematic cross-sectional views for explaining a manufacturing method for a micromechanical pressure sensor device and a corresponding micromechanical pressure sensor device according to a first specific embodiment of the present invention.

FIGS. 1B, 3B through 5B, 7B and 8B show schematic top views corresponding to FIGS. 1A, 3A through 5A, 7A and 8A.

DETAILED DESCRIPTION OF EXAMPLE EMBODIMENTS

Figure 1A:
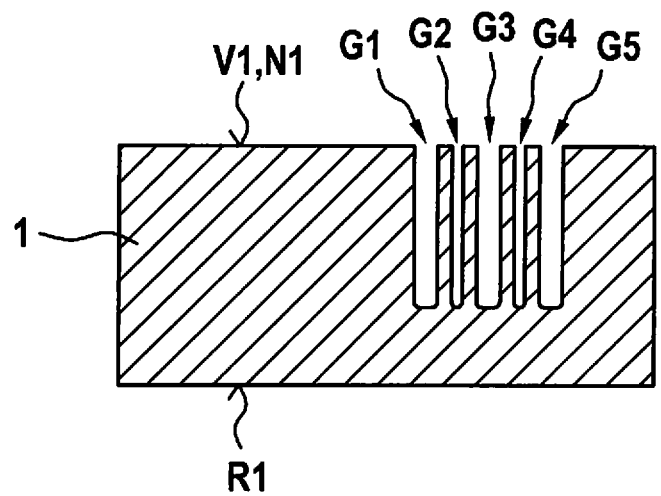

Identical reference symbols in the figures denote identical elements or elements having an identical function.

The steps of the manufacturing method for a micromechanical pressure sensor device shown in the drawings show at least one first through fifth trench G1; G2; G3; G4; G5. This is intended to be understood as an additional specific embodiment of the micromechanical pressure sensor device. The symmetrical design of first trench G1 and of fifth trench G5 makes it in particular possible to carry out a homogeneous pressure measurement.

Furthermore, a mechanical stress may be homogeneously equalized during operation of the micromechanical pressure sensor device.

FIGS. 1A through 8A are schematic cross-sectional views for elucidating a manufacturing method for a micromechanical pressure sensor device and a corresponding micromechanical pressure sensor device according to a first specific embodiment of the present invention.

Figure 1B:
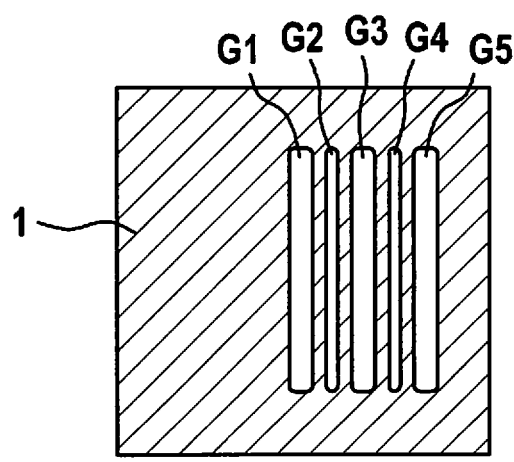

In FIG. 1A, reference numeral 1 denotes a substrate including at least one first through one fifth trench G1; G2; G3; G4; G5. Trenches G1; G2; G3; G4; G5 extend from a front side V1 of substrate 1 in parallel to one another. As shown in FIG. 1A and FIG. 1B, at least first through fifth trenches G1; G2; G3; G4; G5 are freely accessible from front side V1 of substrate 1. An N-lattice N1 may in particular be implemented on front side V1 of substrate 1 (see FIGS. 10A through 13A).

Figure 2A:
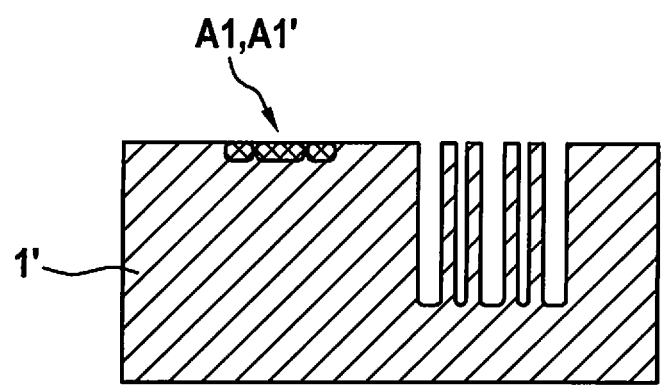

In FIG. 2A, reference numeral 1 denotes an alternative substrate 1', which has an electronic evaluation unit A1 on its front side. Alternatively, electronic evaluation unit A1 may be combined with a bipolar processor A1' or replaced by bipolar processor A1'.

Figure 3A:
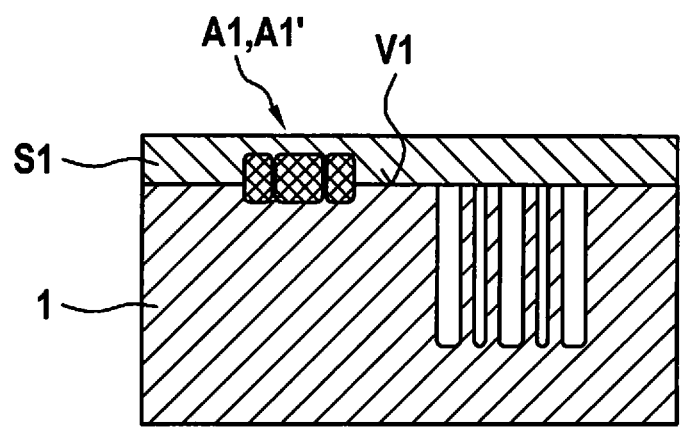
Figure 3B:
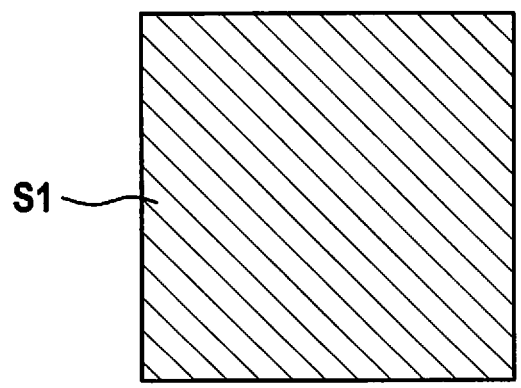

As shown in FIGS. 3A and 3B, a layer S1 is deposited onto front side V1 of substrate 1. In this case, first through fifth trenches G1; G2; G3; G4; G5 are sealed. In the present context, sealing may also be understood to be a hermetic sealing of at least first through fifth trenches G1; G2; G3; G4; G5.

Figure 4A:
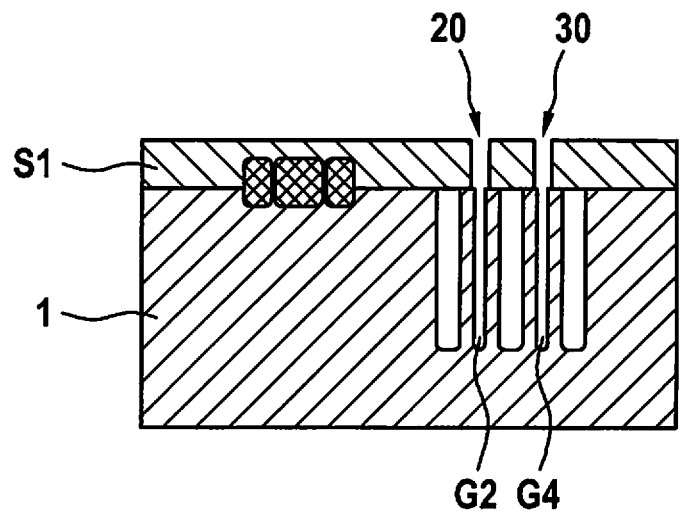
FIGS. 4A', 4B', 7A' show schematic enlargements of corresponding FIG. 4A and FIG. 7A.
Figure 4B:
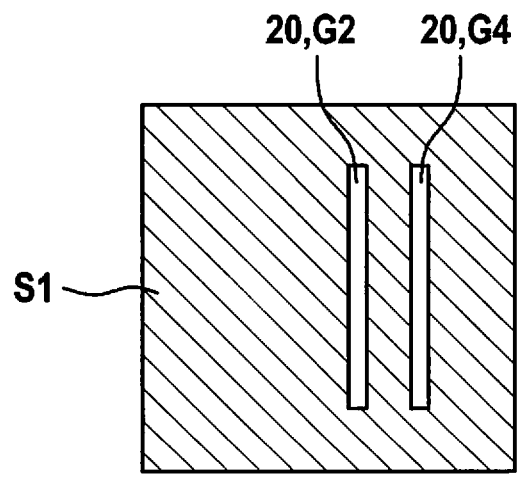
Figure 4A:
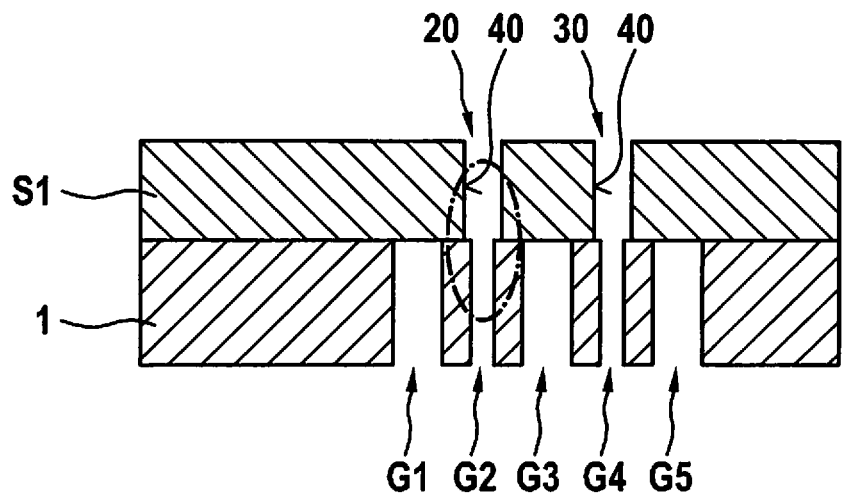
Figure 4B:
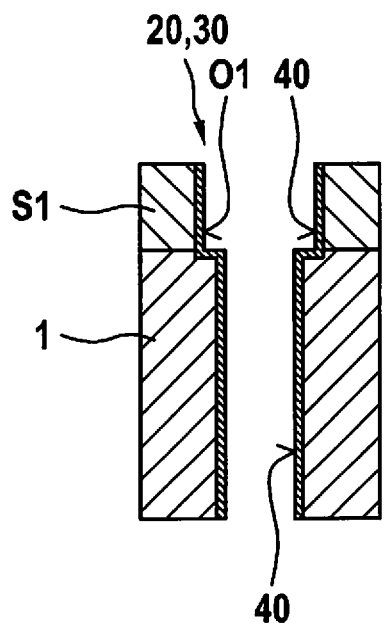

As shown in FIGS. 4A and 4B, layer S1 is structured, contact structures 20; 30 being formed in layer S1 above second and fourth trenches G2; G4.

FIG. 4A' is a corresponding enlargement of FIG. 4A. As shown in FIG. 4A', contact structures 20; 30 are formed above second and fourth trenches G2; G4 in such a way that contact structures 20; 30 do not extend into first trench G1, third trench G3 and fifth trench G5.

FIG. 4B' shows another enlargement of FIG. 4A' (represented by the oval circle in the area of fourth trench G4 of FIG. 4A').

FIG. 4B' shows one of the correspondingly outwardly free-standing side surfaces 40 of contact structures 20; 30 and of second and fourth trenches G2; G4. For example, the oxide layer occurring on side surfaces 40 of contact structures 20; 30 and of second and fourth trenches G2; G4 may be a silicon oxide.

Figure 5A:
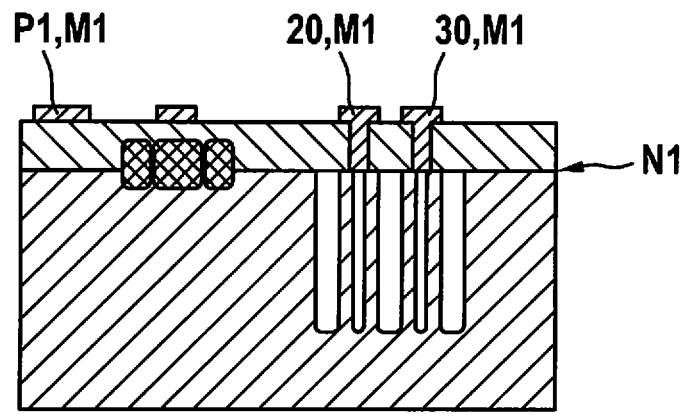

As shown in FIG. 5A, a first metallic contacting material M1 is deposited and structured. In this case, contact structures 20; 30 are filled with first metallic contacting material M1, at least in areas.

Figure 5B:
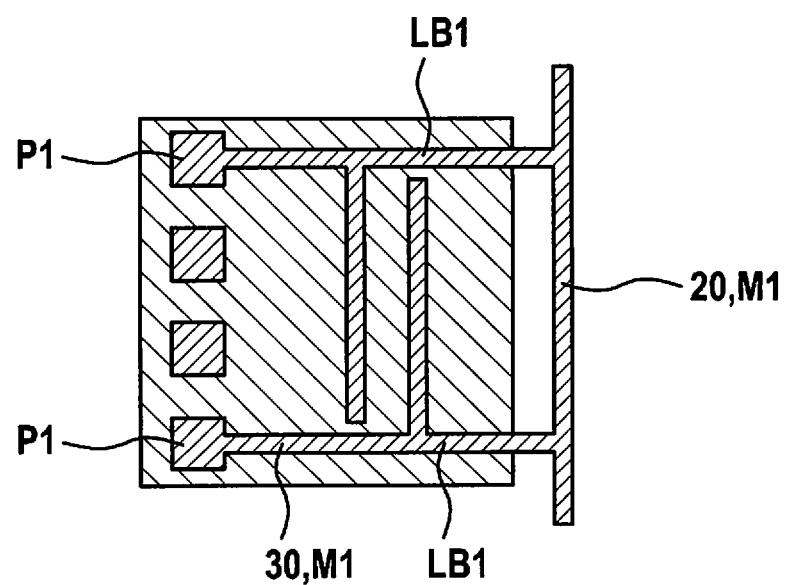

As shown in FIGS. 5A and 5B, after first metallic contacting material M1 has been deposited at least in areas, metallic strip conductors LB1 are formed, it being possible for metallic strip conductors LB1 to be used for the subsequent galvanic deposition of a second metallic contacting material M2. Furthermore, during the structuring of first metallic contacting material M1, bonding pads P1 and electrodes E2; E4 are formed on layer S1. Strip conductors LB1 are electrically insulated from one another and each of them contacts electrodes E2; E4, which are produced when first metallic contacting material M1 is structured.

Figure 6A:
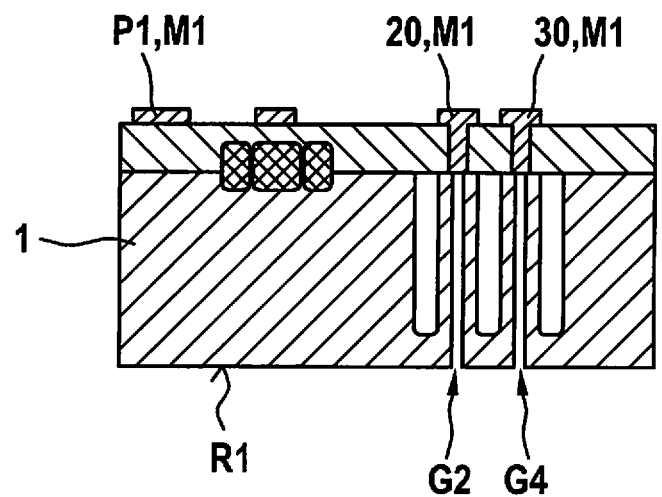

As shown in FIG. 6A, second trench G2 and fourth trench G4 are opened from a rear side R1 of substrate 1. This may take place in particular with the aid of trench etching. In other words, first trench G1, third trench G3 and fifth trench G5 remain sealed or have a vacuum.

Figure 7A:
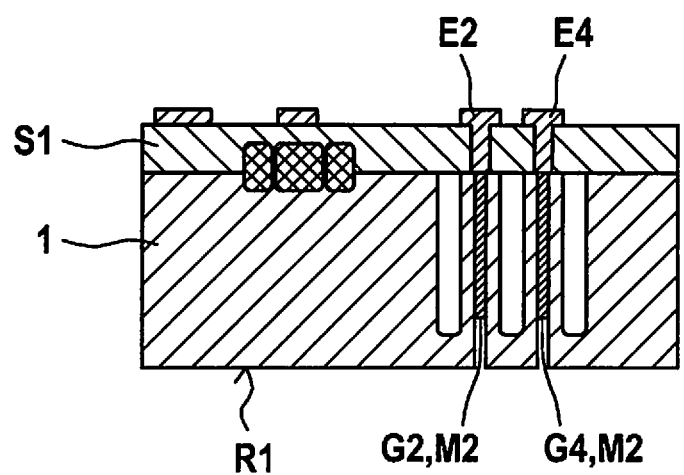
Figure 7A:
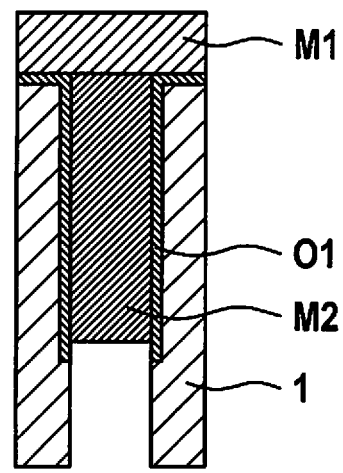

As shown in FIGS. 7A and 7A', a second metallic contacting material M2 is deposited galvanically via rear side R1 of substrate 1 into second and fourth trenches G2; G4. In this case, second metallic contracting material M2 is deposited on oxidized side surfaces 40 (see also FIG. 4B'), resulting in the formation of a pressure-sensitive capacitive capacitor structure K1.

Figure 7B:
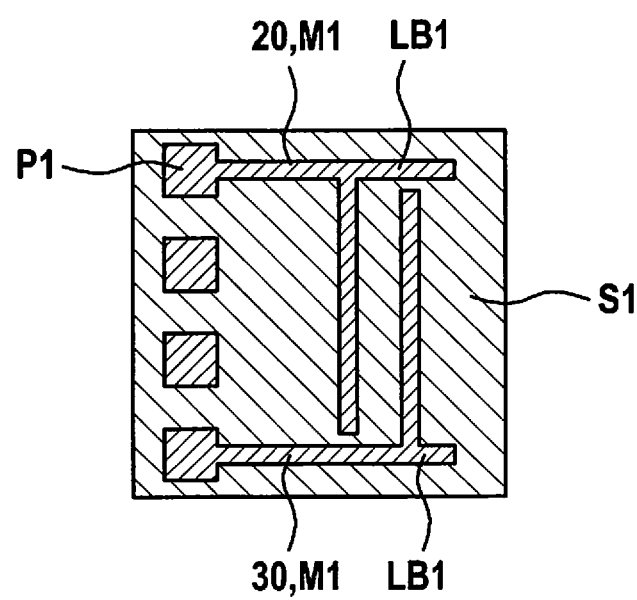

As shown in FIG. 7B, contact structures 20; 30 of second trench and fourth trench G4 are electrically separated from one another.

Figure 8A:
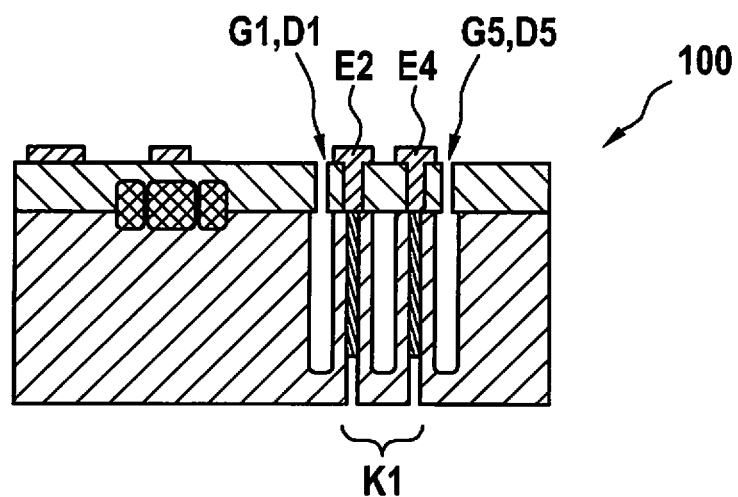

As shown in FIG. 8A, first trench G1 and fifth trench G5 are opened from front side V1 of substrate 1, pressure accesses D1; D5 being formed for pressure-sensitive capacitive capacitor structure K1.

Figure 8B:
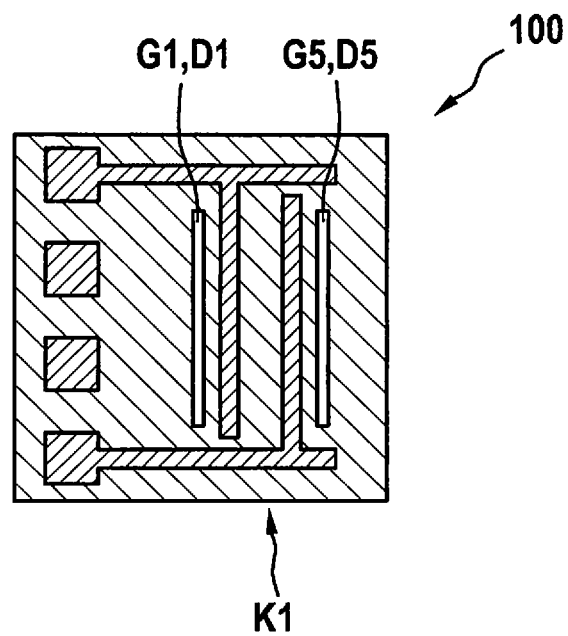

As shown in FIG. 8B, corresponding pressure accesses D1; D5 extend above first trench G1 and fifth trench G5 and in parallel to pressure-sensitive capacitive capacitor structure K1 at a distance, the pressure-sensitive capacitive capacitor structure K1 being located between pressure accesses D1; D5.

Figure 9:
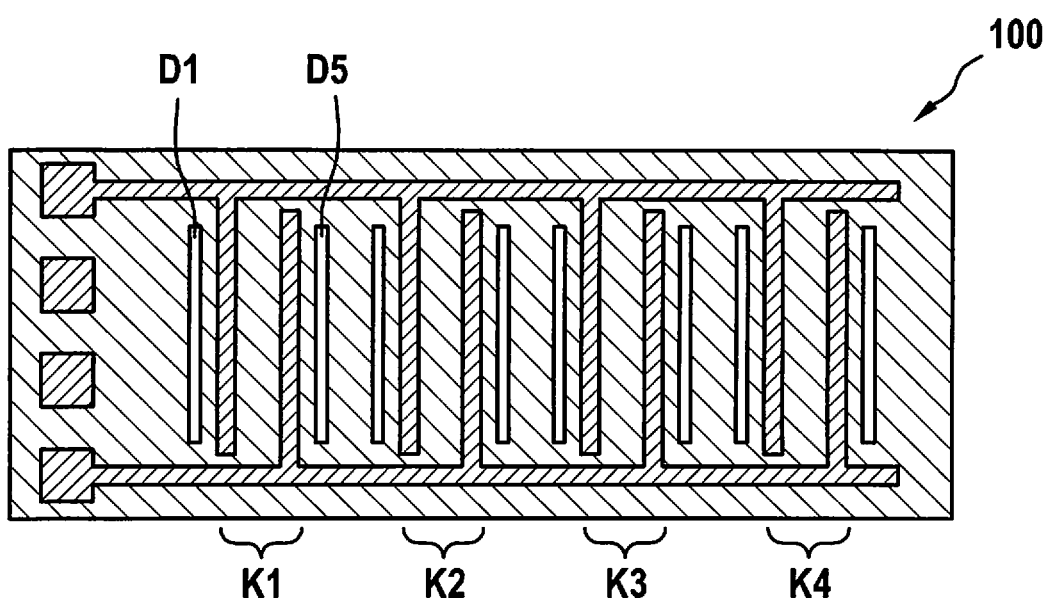
FIG. 9 shows a schematic top view for elucidating a micromechanical pressure sensor device according to a second specific embodiment of the present invention.

FIG. 9 shows a schematic top view for elucidating a micromechanical pressure sensor device according to a second specific embodiment of the present invention.

As shown in FIG. 9, micromechanical pressure sensor device 100 includes four series-connected pressure sensitive capacitive capacitor structures K1; K2; K3; K4. Each of the four series-connected pressure sensitive capacitive capacitor structures K1; K2; K3; K4 includes corresponding pressure accesses D1; D5.

It should be understood that the manufacturing method described here may be used, in particular, for manufacturing micromechanical pressure sensor devices including a plurality of series-connected and/or parallel-connected pressure-sensitive capacitive capacitor structures.

FIGS. 10A through 13A are schematic cross-sectional views for elucidating a method for producing an exemplary first trench and an exemplary second trench based on an APSM technology according to the first or second specific embodiment of the present invention, FIGS. 10B through 13B representing corresponding top views of FIGS. 10A through 13A.

Figure 10A:
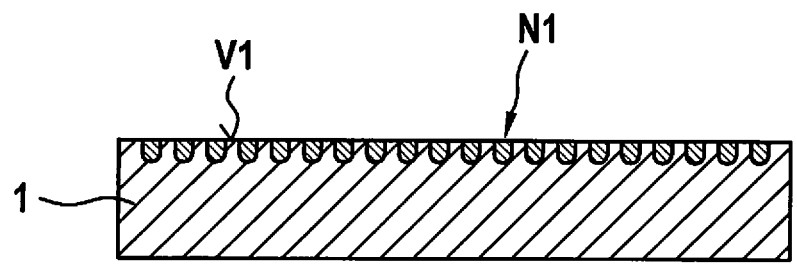
FIGS. 10A through 14A show schematic cross-sectional views for elucidating a method for producing an exemplary first trench and an exemplary second trench based on an APSM technology, FIGS. 10B through 14B being corresponding top views of FIGS. 10A through 14A.
Figure 10B:
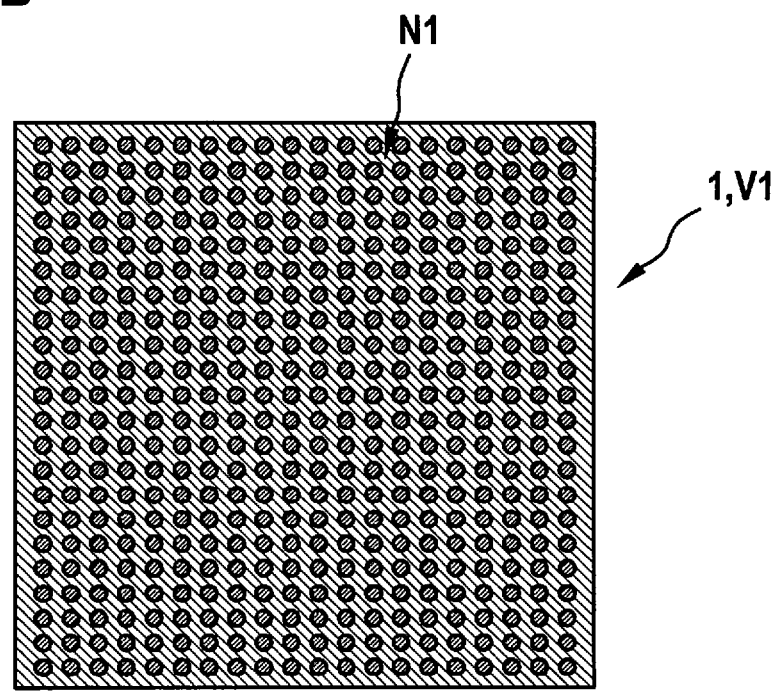
Figure 11A:
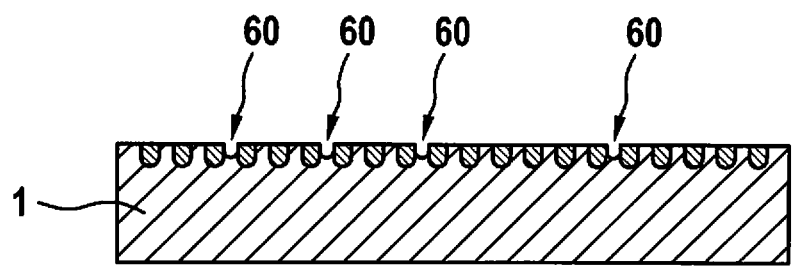
Figure 11B:
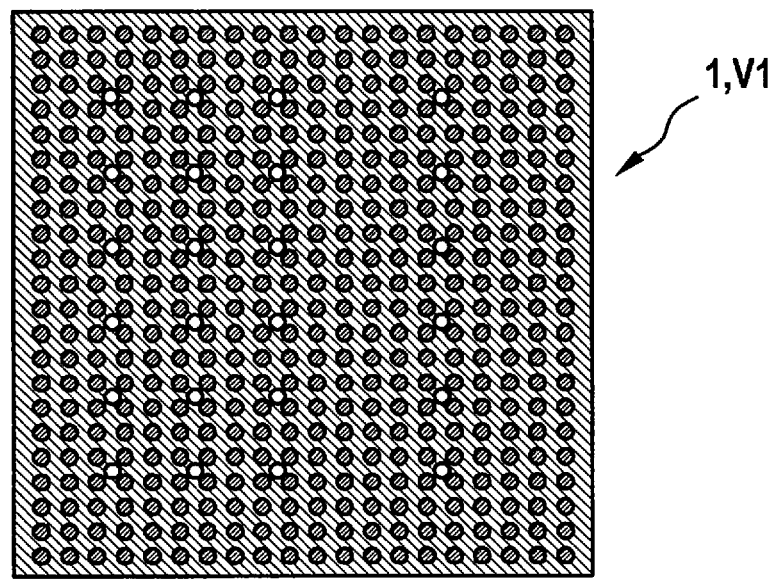

FIG. 10A shows a substrate 1 having a front side V1, the N-lattice being implemented on front side V1.

Figure 12A:
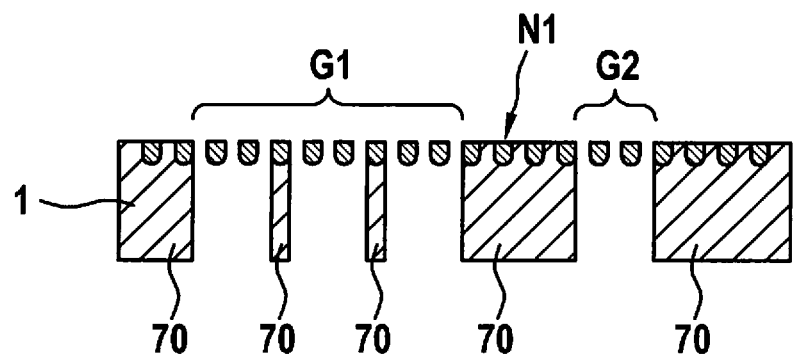
Figure 12B:
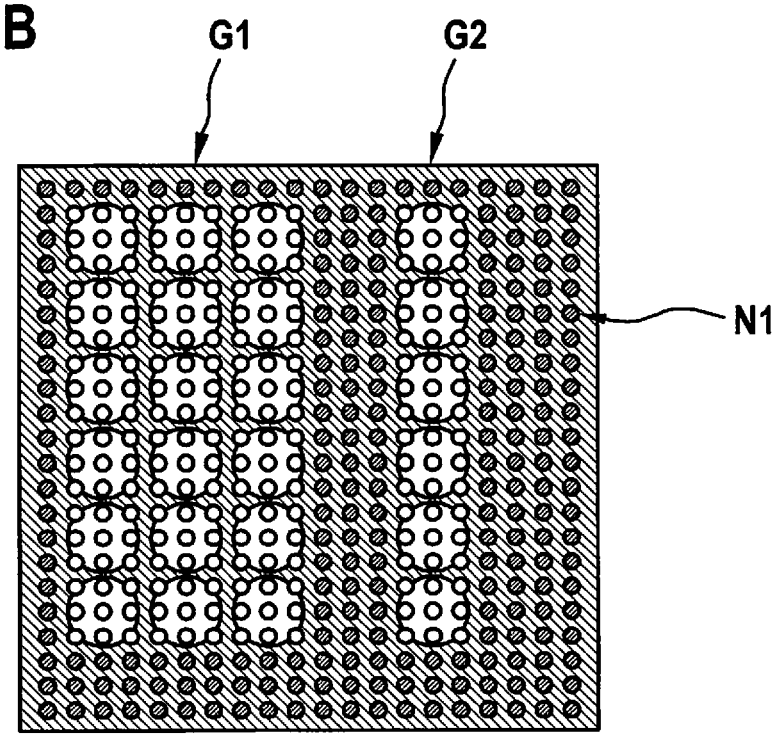

In order to provide first trench G1 and second trench G2, the front side is appropriately pre-structured (notches 60), so that macroscopic pores or trenches are created transversely or, in particular, perpendicularly to front side V1 of the substrate, as shown in FIG. 12A. In particular, material residues 70 of substrate 1 may remain in this case.

Figure 13A:
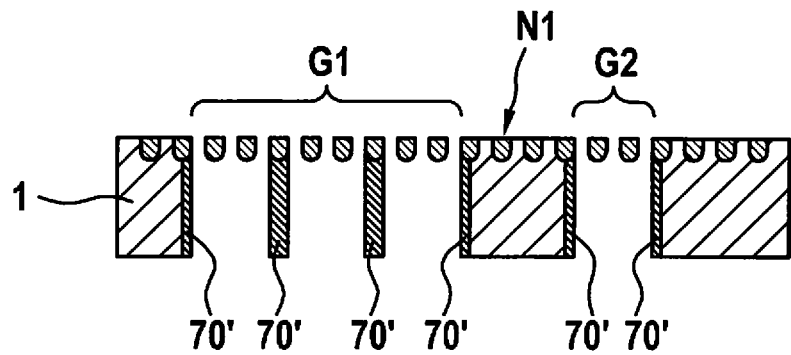
Figure 13B:
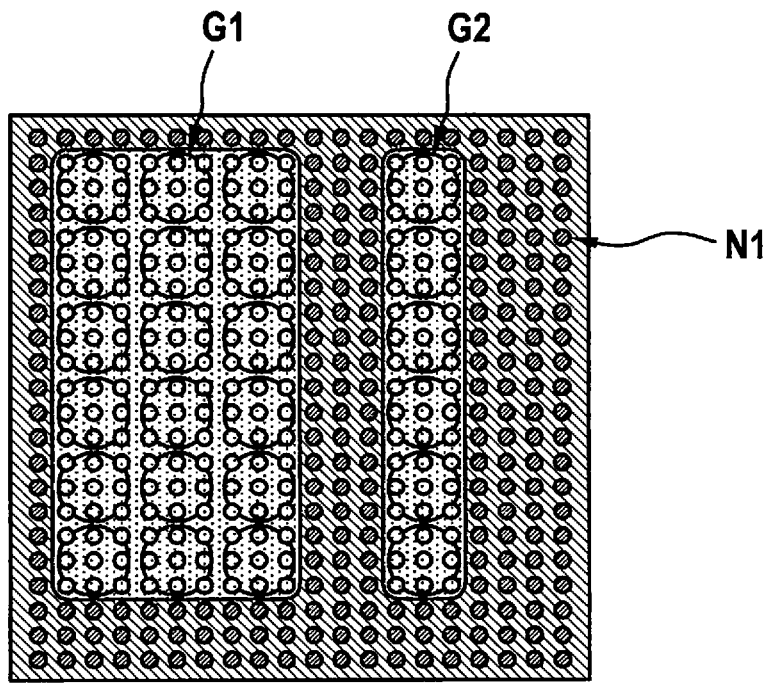

As shown in FIG. 13A, these material residues 70 may be removed by oxidation or correspondingly by sintering (see transition from FIG. 13A to FIG. 14A), if these material residues 70' are thin enough. In this case, however, areas including material residues 70, which have appropriate wall thicknesses, are spared and form first trench G1 and second trench G2.

Figure 14A:
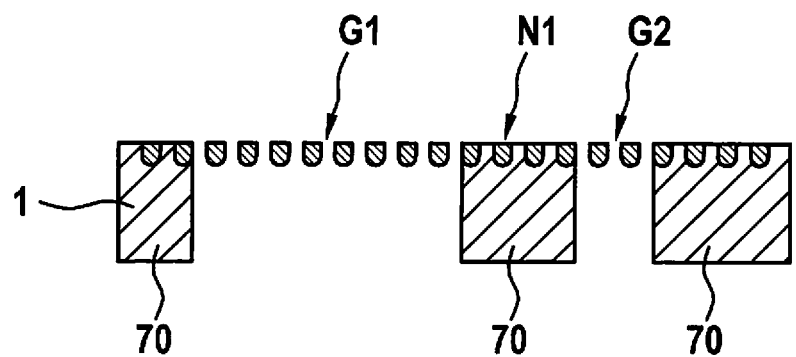
Figure 14B:
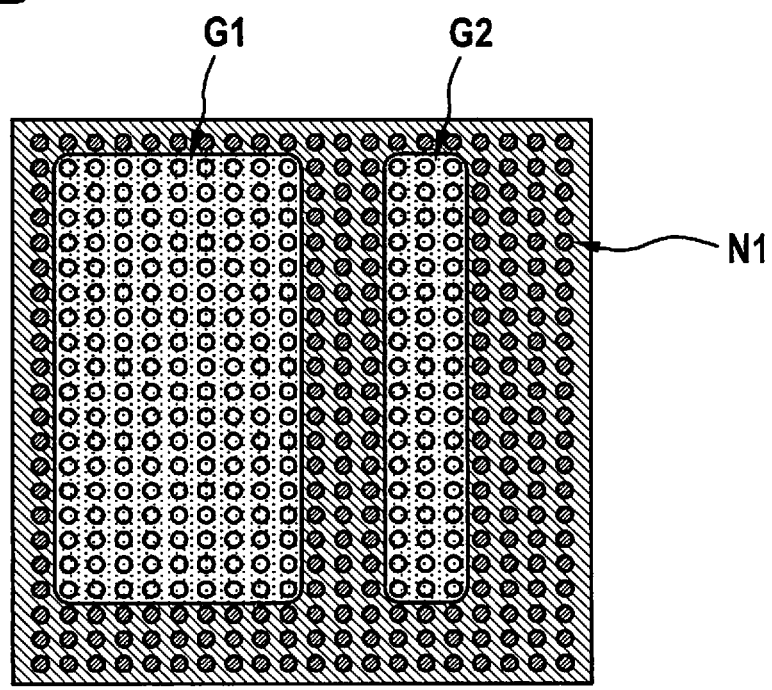

As shown in FIG. 14A, substrate 1, which is provided for the manufacturing method described here for micromechanical pressure sensor device 100, includes N-lattice N1 and first trench G1 and second trench G2 which are shown here as an example. FIGS. 10B through 14B show corresponding top views of the schematic side representations.

In other words, the production of the trenches is based in particular on the ASPM method.

Using the micromechanical sensor device described here, it is in particular possible to measure a pressure of approximately 1000 millibars. This pressure range is of particular interest for customer applications.

Although the present invention has been described with reference to preferred exemplary embodiments, it is not limited thereto. In particular, the above-named named materials and topologies are only exemplary and not limited to the explained examples.

What is claimed is:

1. A manufacturing method for a micromechanical pressure sensor device, comprising:
   A) providing a substrate including at least one first through a fourth trench, which run in parallel to one another at a distance to one another, starting from a front side of the substrate;
   B) depositing a layer onto the front side, the at least first through fourth trenches being sealed by the layer, and structuring the layer, contact structures being formed in the layer above the second and fourth trenches;
   C) oxidizing outwardly free-standing side surfaces of the contact structures and of the second and fourth trenches;
   D) depositing and structuring a first metallic contacting material, the contact structures being filled with the first metallic contacting material;
   E) opening the second trench and the fourth trench from a rear side of the substrate;
   F) galvanically depositing a second metallic contacting material via the rear side of the substrate into the second and fourth trenches, the second metallic contacting material being deposited on the oxidized side surfaces, resulting in the formation of a pressure-sensitive capacitive capacitor structure; and
   G) opening the first trench from the front side of the substrate, a pressure access being formed for the pressure-sensitive capacitive capacitor structure.

2. The manufacturing method as recited in claim 1, wherein an N-lattice is implemented on the front side of the substrate for forming the at least first through fourth trenches.

3. The manufacturing method as recited in claim 1, wherein a porous silicon is used for the substrate.

4. The manufacturing method as recited in claim 1, wherein at least one of an electronic evaluation unit and a bipolar processor, is integrated into the substrate on the substrate level.

5. The manufacturing method as recited in claim 1, wherein a monocrystalline silicon is used for the layer.

6. The manufacturing method as recited in claim 1, wherein the side surfaces, which are oxidized, are used for depositing the first metallic contacting material and the second metallic contacting material.

7. The manufacturing method as recited in claim 1, wherein when the first metallic contacting material is deposited and structured, metallic strip conductors are formed, and the metallic strip conductors are used for the galvanic deposition of the second metallic contacting material.

8. The manufacturing method as recited in claim 7, wherein the metallic strip conductors are at least partially removed, after the galvanic deposition of the second metallic contacting material.

* * * * *